United States Patent
Nomura et al.

(10) Patent No.: US 10,812,029 B2
(45) Date of Patent: Oct. 20, 2020

(54) OPERATIONAL AMPLIFIER

(71) Applicant: ROHM CO., LTD., Kyoto-shi, Kyoto (JP)

(72) Inventors: Naohiro Nomura, Kyoto (JP); Takatoshi Manabe, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 9 days.

(21) Appl. No.: 16/232,239

(22) Filed: Dec. 26, 2018

(65) Prior Publication Data

US 2019/0199304 A1 Jun. 27, 2019

(30) Foreign Application Priority Data

Dec. 27, 2017 (JP) .................. 2017-252125

(51) Int. Cl.
*H03F 1/14* (2006.01)
*H03F 3/45* (2006.01)
*H03G 3/30* (2006.01)
*H03F 1/26* (2006.01)

(52) U.S. Cl.
CPC ......... *H03F 3/45273* (2013.01); *H03F 1/26* (2013.01); *H03F 3/45192* (2013.01); *H03F 3/45269* (2013.01); *H03F 3/45659* (2013.01); *H03G 3/30* (2013.01); *H03F 2203/45156* (2013.01); *H03F 2203/45338* (2013.01); *H03F 2203/45652* (2013.01)

(58) Field of Classification Search
CPC . H03F 3/45; H03F 3/191; H03F 3/193; H03F 1/14; H03F 1/56
USPC .................................. 330/260, 292
See application file for complete search history.

(56) References Cited

U.S. PATENT DOCUMENTS

2013/0207722 A1* 8/2013 Bulzacchelli ........... H03F 3/195
330/260

FOREIGN PATENT DOCUMENTS

JP 2003188652 A 7/2003

* cited by examiner

*Primary Examiner* — Steven J Mottola
(74) *Attorney, Agent, or Firm* — Cantor Colburn LLP

(57) ABSTRACT

An operational amplifier includes a gain boost circuit. The gain boost circuit includes a first differential gm amplifier of a first stage, and a second differential gm amplifier of a post stage. Phase compensation capacitors are provided between inputs and outputs of a system of the second differential gm amplifier.

8 Claims, 7 Drawing Sheets

<Prior Art>

OPERATIONAL AMPLIFIER

CROSS-REFERENCE TO RELATED APPLICATION

The present application claims priority under 35 U.S.C. § 119 to Japanese Patent Application No. 2017-252125, filed on Dec. 27, 2017, the entire contents of which are incorporated herein by reference.

BACKGROUND OF THE INVENTION

1. Field of the Invention

The present invention relates to an operational amplifier.

2. Description of the Related Art

In many electronic circuits, an operational amplifier (differential amplifier) is used. For amplification of a minute signal, reduction of noise of the operational amplifier is required. At present, as a complementary metal oxide semiconductor (CMOS) operational amplifier with low noise, one with an equivalent input noise voltage of 5.5 nv/√Hz at 1 kHz is commercially available (NJU77806 manufactured by New Japan Radio Co., Ltd.).

FIG. 1A and FIG. 1B are circuit diagrams of a CMOS operational amplifier. A CMOS operational amplifier 100R in FIG. 1A includes a differential input pair 10, a tail current source 12, a load circuit 14, an output stage 16, and a gain boost circuit 20.

A theoretical formula of noise of the CMOS operational amplifier is given by Formula (1).

$$\overline{V_n^2} = 2\left[\frac{8}{3}kT\frac{1}{g_{m12}}\left(1+\frac{g_{m34}}{g_{m12}}\right)+\frac{1}{C_{ox}f}\left(\frac{K_P}{(WL)_{12}}+\frac{K_n}{(WL)_{34}}\right)\frac{g_{m34}^2}{g_{m12}^2}\right] \quad (1)$$

In Formula (1), a first term represents thermal noise and a second term represents flicker noise (1/f noise).

A theoretical formula of transconductance of a metal oxide semiconductor (MOS) transistor is expressed by Formula (2).

$$g_m = \frac{dI_D}{dV_{gs}} = \beta(V_{gs}-V_{th}) = \frac{\mu C_{ox}}{2}\frac{W}{L}(V_{gs}-V_{th}) = \sqrt{2\mu C_{ox}\frac{W}{L}I}. \quad (2)$$

From Formula (1), it is necessary to reduce the flicker noise and the thermal noise to reduce the noise of the CMOS operational amplifier. In order to reduce the flicker noise, it is effective to increase a channel width W and a channel length L, that is, to increase element area. In addition, in order to reduce the thermal noise, it is effective to lower a channel resistance of the differential input pair 10, and for lowering the channel resistance, it is necessary to increase the channel width W of the differential input pair 10. By increasing the channel width W and the channel length L, a parasitic capacitance of an input terminal is increased.

In addition, as a countermeasure against noise due to a circuit type, the thermal noise and the flicker noise can be reduced by increasing transconductance $g_{m12}$ of a differential input transistor. As a method for increasing transconductance $g_m$, a method using the gain boost circuit 20 is known (Japanese Patent Application (Laid Open) No. 2003-188652).

FIG. 1B is a circuit diagram of the gain boost circuit 20. As a countermeasure against noise of the gain boost circuit 20 itself, it is required to increase a transistor size of a differential input pair 22, which is also a factor of increasing the parasitic capacitance.

The increase in the parasitic capacitance is a factor of deteriorating a phase margin. FIG. 2 is a circuit diagram illustrating an example of an application using an operational amplifier. Here, a non-inverting amplifier is illustrated. An RC filter is formed by a feedback resistor Rf and a parasitic capacitance Cp, thereby causing a phase delay. An output resistance Ro of the amplifier and a load capacitance CL generated in the application also form the RC filter, thereby causing the phase delay. A transfer function of this filter is expressed by Formula (3).

$$H(s) = \frac{1}{1+R_o C_L s} \times \frac{1}{1+R_f C_p s} \quad (3)$$

As the parasitic capacitance Cp and the load capacitance CL are larger, a pole due to the filter formed by the parasitic capacitance Cp and the load capacitance CL moves toward a lower frequency side, and the phase margin being a measure of stability of the operational amplifier deteriorates.

FIG. 3A is a diagram illustrating a relationship between noise voltage density and the element area. As can be seen from FIG. 3A, when trying to achieve noise voltage density smaller than 5 nV/√Hz, the element area abruptly increases.

As for the parasitic capacitance Cp, since a combined capacitance of a gate capacitance of the differential input pair 10 of FIG. 1A and a gate capacitance of the differential input pair 22 of the gain boost circuit 20 of FIG. 1B is dominant, increasing the transistor size for noise reduction is a factor that deteriorates the stability of the operational amplifier. In other words, it can be said that low noise and the stability of the operational amplifier are in a trade-off relationship.

FIG. 3B is a diagram illustrating a relationship between the load capacitance CL and the phase margin. A phase margin at CL=10 pF of an operational amplifier designed with 5 nV/√Hz is 60° or more, whereas a phase margin of an operational amplifier designed with 3.2 nV/√Hz is deteriorated by nearly 20° to be smaller than 50°.

In addition, when a load capacitance CL at which the phase margin becomes 0° is determined as load capacitance tolerance, load capacitance tolerance of the operational amplifier designed with 5 nV/√Hz is about 600 pF, whereas load capacitance tolerance of the operational amplifier designed with 3.2 nV/√Hz is deteriorated by about 100 pF to be about 500 pF.

SUMMARY OF THE INVENTION

The present invention has been made in view of the above problems, and one of general purposes of one embodiment of the present invention is to provide an operational amplifier achieving both noise reduction and stability.

One embodiment of the present invention relates to an operational amplifier. The operational amplifier includes a gain boost circuit. The gain boost circuit includes a first differential conductance amplifier of a first stage, a second differential conductance amplifier of a post stage, including two pairs of input and output ports, and two phase compensation capacitors each provided between the input and the output ports of corresponding one of the two pairs of the second differential conductance amplifier.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, "a state where a member A is connected to a member B" includes, in addition to a case where the member A and the member B are physically and directly connected, a case where the member A and the member B are indirectly connected via another member which does not affect an electrical connection state or does not hinder functions of the member A and the member B.

Similarly, "a state where a member C is provided between the members A and the member B" includes, in addition to a case where the member A and the member B or the member B and the member C are directly connected, a case where the member A and the member B or the member B and the member C are indirectly connected via another member which does not affect an electrical connection state or does not hinder functions of the member A and the member B or the member B and the member C.

Figure 1A:
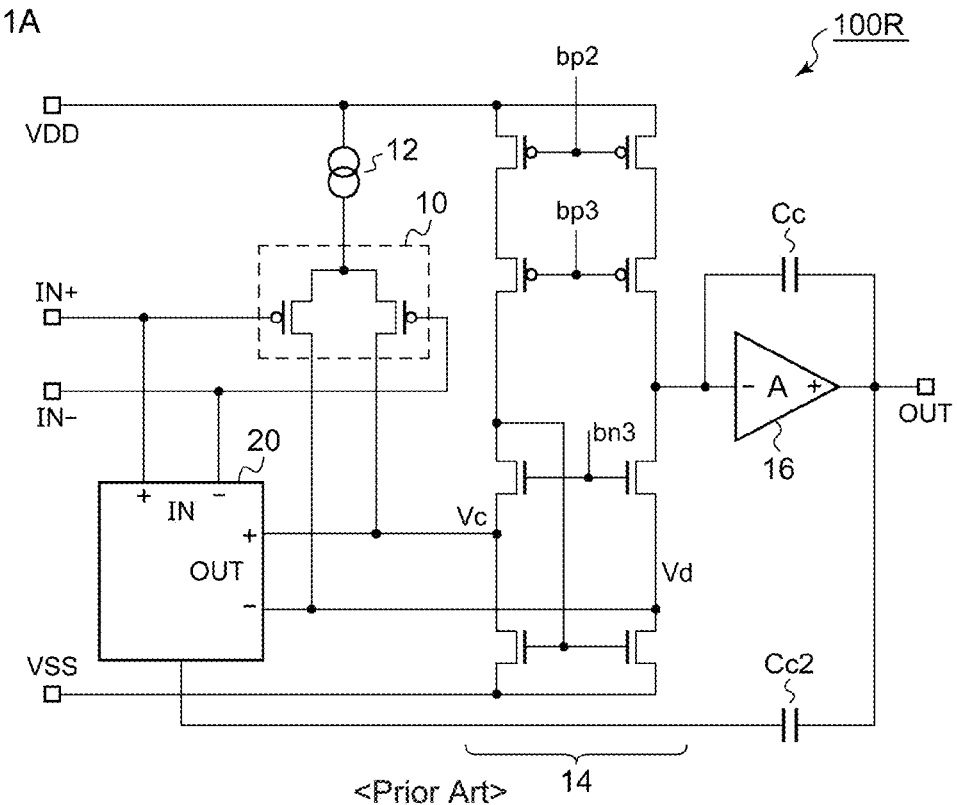
FIG. 1A and FIG. 1B are circuit diagrams of a complementary metal oxide semiconductor (CMOS) operational amplifier.
Figure 1B:
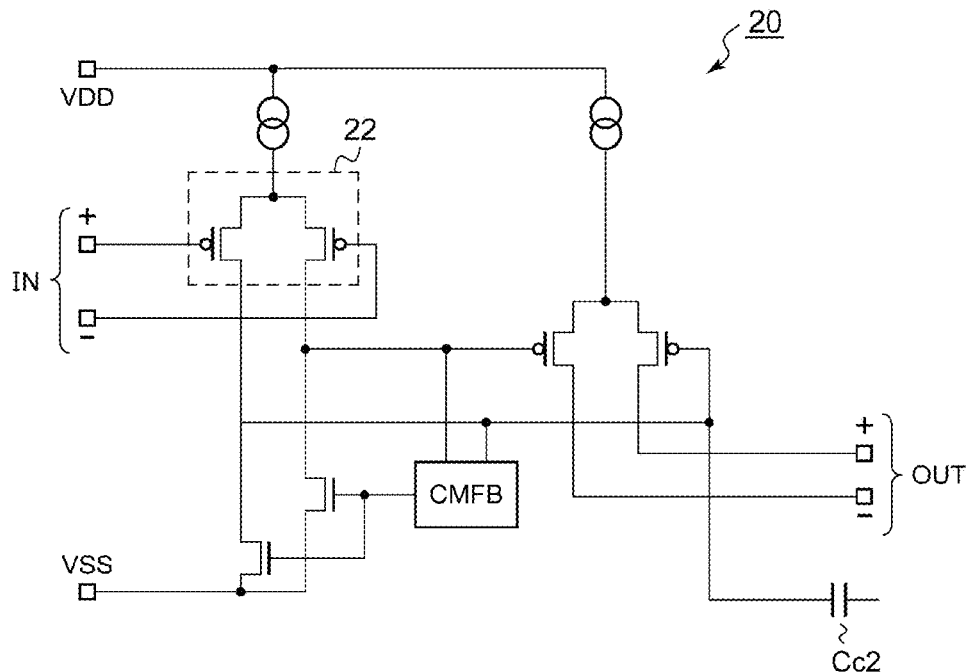
Figure 2:
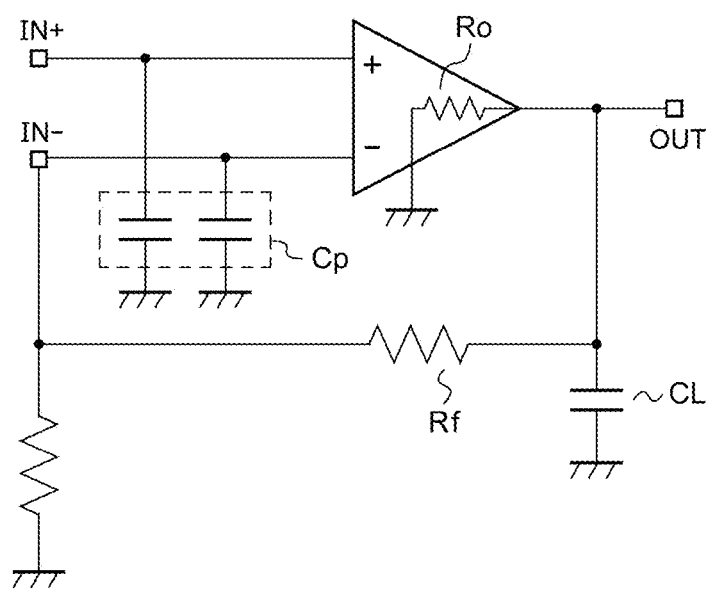
FIG. 2 is a circuit diagram illustrating an example of an application using an operational amplifier.
Figure 3A:
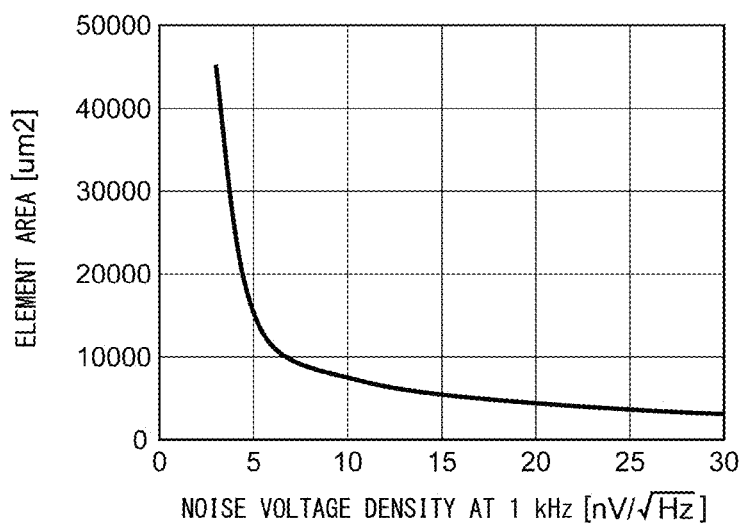
FIG. 3A is a diagram illustrating a relationship between noise voltage density and element area.
Figure 3B:
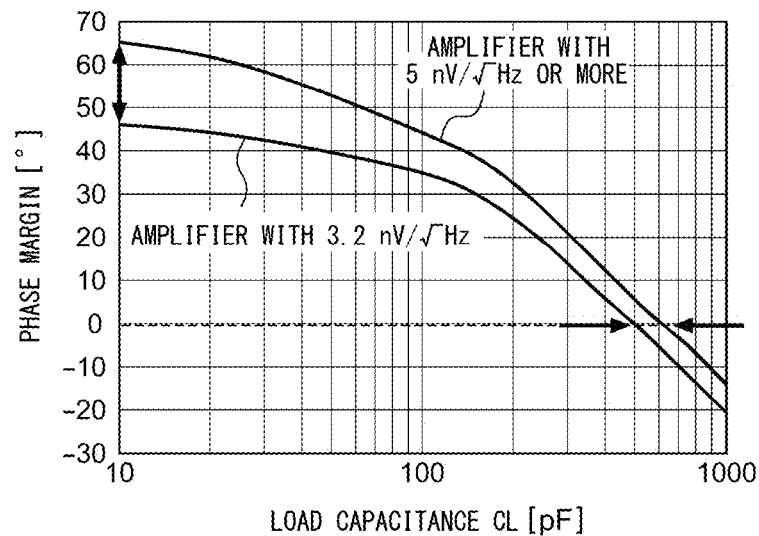
FIG. 3B is a diagram illustrating a relationship between a load capacitance CL and a phase margin.
Figure 4:
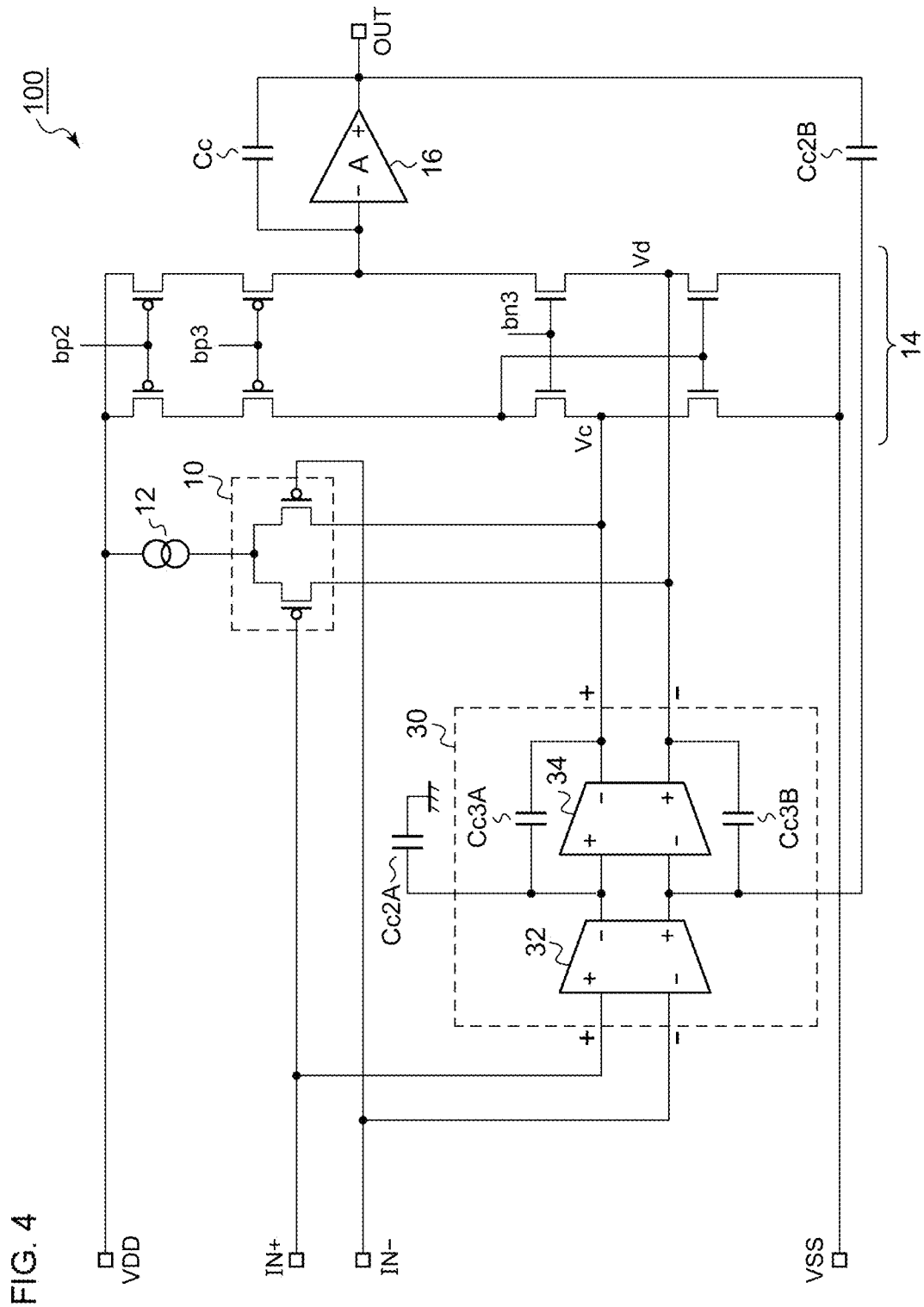
FIG. 4 is a circuit diagram of an operational amplifier according to an embodiment.

FIG. 4 is a circuit diagram an operational amplifier 100 according to an embodiment. The operational amplifier 100 includes a differential input pair 10, a current source 12, a load circuit 14, an output stage 16, and a gain boost circuit 30. The operational amplifier 100 is integrated in one semiconductor substrate. One or a plurality of operational amplifiers 100 is accommodated in a package of an operational amplifier integrated circuit (IC). Alternatively, the operational amplifier may be a part of a function IC.

The differential input pair 10 includes a P-channel metal oxide semiconductor (PMOS) transistors M1 and M2. The current source 12 is connected to sources of the PMOS transistors M1 and M2 to supply a constant current (tail current). Drains of the PMOS transistors M1 and M2 are connected to the load circuit 14 of a post stage.

The load circuit 14 converts a differential current generated in the differential input pair 10 into a voltage. A configuration of the load circuit 14 and a configuration of a circuit that generates bias voltages bn3, bp3, and bp2 of the load circuit 14 are not particularly limited, and a known technique can be used. The output stage 16 receives an output of the load circuit 14 and generates an output voltage $V_{OUT}$ corresponding to the received output at an output terminal OUT. A configuration of the output stage 16 is also not particularly limited.

Those skilled in the art will appreciate that there are various variations in the configurations of the load circuit 14 and the output stage 16, and such variations are also included in the present invention.

The gain boost circuit 30 includes a first differential transconductance amplifier (hereinafter referred to as a first differential gm amplifier) 32 of a first stage, a second differential transconductance amplifier (hereinafter referred to as a second differential gm amplifier) 34 of a post stage, and two phase compensation capacitors Cc3A and Cc3B. A first phase compensation capacitor Cc3A is provided between a non-inverting input terminal (+) and an inverting output terminal (−) of the second differential gm amplifier 34, and a second phase compensation capacitor Cc3B is provided between an inverting input terminal (−) and a non-inverting output terminal (+) of the second differential gm amplifier 34. Note that an output differential current of the first differential gm amplifier 32 is converted into a differential voltage by a load circuit (not illustrated), and is supplied to the second differential gm amplifier 34 of the post stage.

Figure 5:
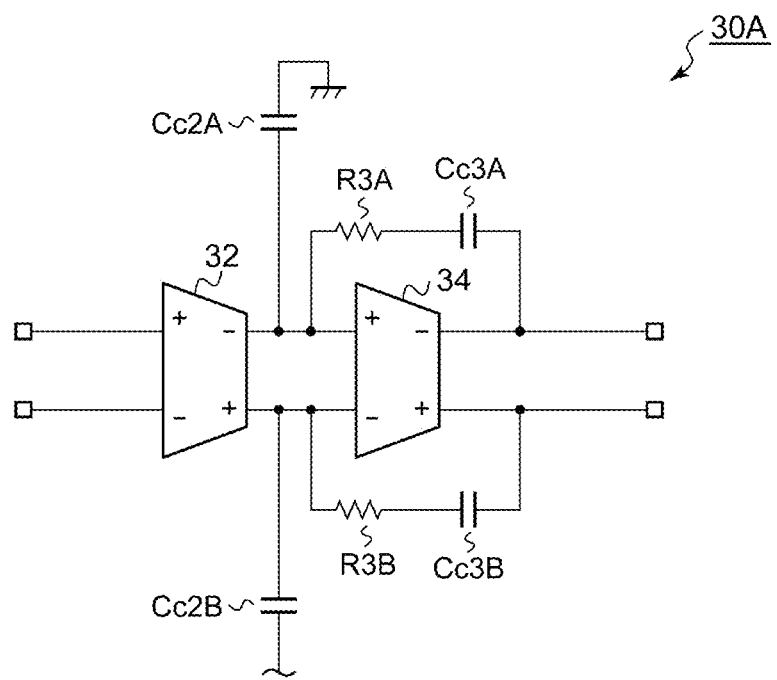
FIG. 5 is a circuit diagram illustrating a modification of a gain boost circuit.

The basic configuration of the operational amplifier 100 has been described above. FIG. 5 is a circuit diagram illustrating a modification of a gain boost circuit 30A. The gain boost circuit 30A includes phase lead resistors R3A and R3B, in addition to the gain boost circuit 30 of FIG. 4. The phase lead resistor R3A is provided in series with the first phase compensation capacitor Cc3A, and the phase lead resistor R3B is provided in series with the second phase compensation capacitor Cc3B.

Figure 6:
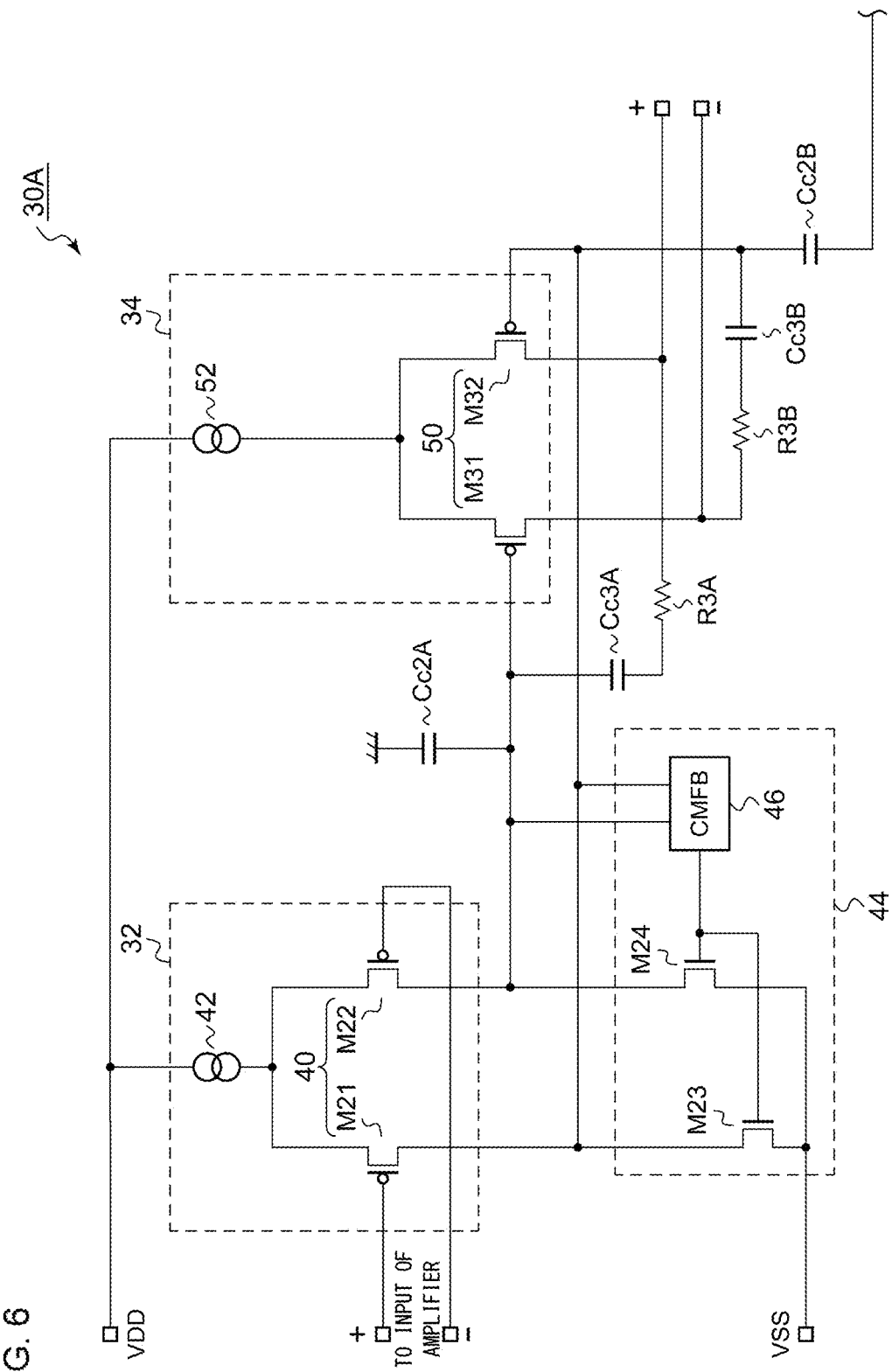
FIG. 6 is a circuit diagram illustrating one configuration example of the gain boost circuit of FIG. 4.

FIG. 6 is a circuit diagram illustrating one configuration example of the gain boost circuit 30A of FIG. 4. The first differential gm amplifier 32 includes a first differential input pair 40 and a first current source 42. The first differential input pair 40 includes PMOS transistors M21 and M22. The first current source 42 supplies a constant current to the first differential input pair 40.

A load circuit 44 converts a differential output current of the first differential gm amplifier 32 into a differential voltage. The load circuit 44 includes a pair of load transistors M23 and M24 and a common mode feedback circuit 46. The common mode feedback circuit 46 adjusts a gate voltage of the pair of load transistors M23 and M24 such that a common mode voltage $V_{COM}$ of an output of the first differential input pair approaches a target voltage. A configuration of the common mode feedback circuit 46 is not particularly limited.

The second differential gm amplifier 34 includes a second differential input pair 50 and a second current source 52. The second differential input pair 50 includes a first PMOS transistor M31 and a second PMOS transistor M32. The second current source 52 supplies a constant current to the second differential input pair 50. The phase compensation capacitors Cc3A and Cc3B are provided between a gate and a drain of the first PMOS transistor M31 and the second PMOS transistor M32. The configuration example of the gain boost circuit 30A has been described above.

Figure 7:
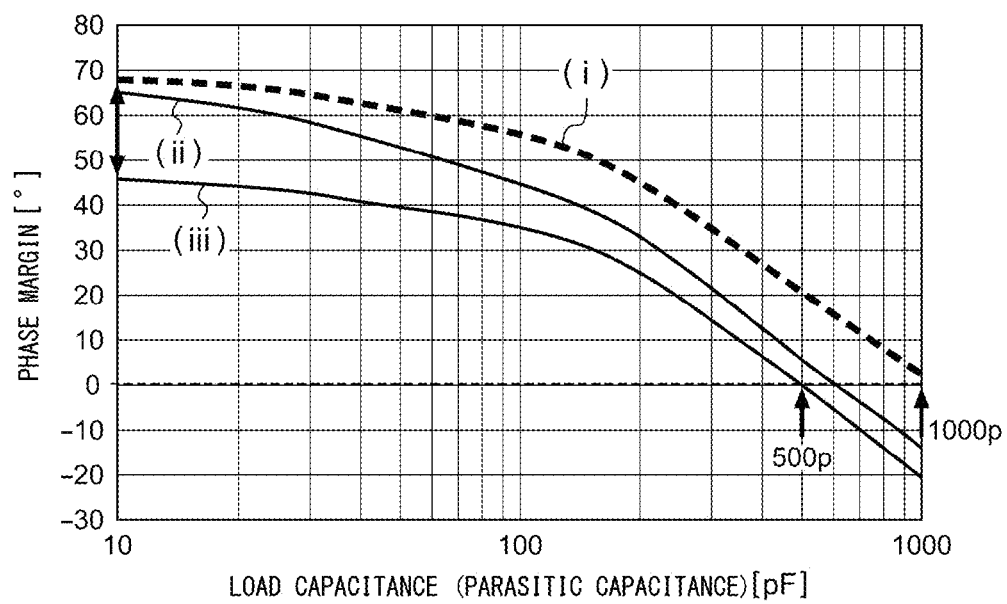
FIG. 7 is a diagram illustrating phase margins of the operational amplifier according to the embodiment and a conventional operational amplifier.

FIG. 7 is a diagram illustrating phase margins of the operational amplifier 100 according to the embodiment and a conventional operational amplifier. (i) indicates a phase margin of an operational amplifier 100 designed with 2.9 nV/√Hz using architecture described in the embodiment. (ii) indicates a phase margin of an operational amplifier 100R designed with 5 nV/√Hz using conventional architecture. (iii) indicates a phase margin of an operational amplifier 100R designed with 3.2 nV/√Hz using conventional architecture.

In the operational amplifier 100 according to the embodiment, as indicated by (i), a phase margin is 68° at a low load capacitance (10 pF) and improved by 22° compared to a phase margin of 46° at the low load capacitance (10 pF) in a reverse direction in the conventional operational amplifier 100R indicated by (iii).

In addition, when load capacitance tolerance is compared, load capacitance tolerance of the conventional operational amplifier 100R is 500 pF, whereas load capacitance tolerance of the operational amplifier 100 according to the embodiment is greatly improved to 1000 pF.

Note that, from the comparison between (i) and (ii), the operational amplifier 100 according to the embodiment designed with 2.9 nV/√Hz has a larger phase margin than that of the conventional operational amplifier 100R designed with 5 nV/√Hz.

As described above, the configurations of the load circuit 14 and the output stage 16 are not limited. For example, the output stage 16 may be modified to constitute a differential output operational amplifier (fully differential amplifier).

While the preferred embodiments of the present invention have been described using specific terms, such description is for illustrative purposes only, and it is to be understood that changes and variations may be made without departing from the spirit or scope of the appended claims.

What is claimed is:

1. An operational amplifier comprising a gain boost circuit, wherein
the gain boost circuit includes:
a first differential conductance amplifier of a first stage;
a second differential conductance amplifier of a post stage, including two pairs of input and output ports; and
two phase compensation capacitors, each provided between the input and the output ports of a respective one of the two pairs of the second differential conductance amplifier,
wherein the gain boost circuit further includes two resistors, each provided in series with corresponding one of the two phase compensation capacitors.

2. The operational amplifier according to claim 1, wherein the first differential conductance amplifier includes:
a first differential input pair; and
a first constant current source structured to supply an electric current to the first differential input pair.

3. An operational amplifier comprising a gain boost circuit, wherein
the gain boost circuit includes:
a first differential conductance amplifier of a first stage;
a second differential conductance amplifier of a post stage, including two pairs of input and output ports, and
two phase compensation capacitors, each provided between the input and the output ports of respective one of the two pairs of the second differential conductance amplifier,
wherein
the first differential conductance amplifier includes:
a first differential input pair; and
a first constant current source structured to supply an electric current to the first differential input pair; and
wherein the gain boost circuit further includes:
a pair of load transistors provided to the first differential input pair as a load; and
a common mode feedback circuit structured to adjust a gate voltage of the pair of load transistors such that a common mode voltage of an output of the first differential input pair approaches a target voltage.

4. The operational amplifier according to claim 1, wherein the second differential conductance amplifier includes:
a second differential input pair including a first transistor and a second transistor; and
a second constant current source structured to supply an electric current to the second differential input pair.

5. An operational amplifier comprising a gain boost circuit, wherein
the gain boost circuit includes:
a first differential conductance amplifier of a first stage;
a second differential conductance amplifier of a post stage, including two pairs of input and output ports; and
two phase compensation capacitors, each provided between the input and the output ports of a respective one of the two pairs of the second differential conductance amplifier,
wherein
the second differential conductance amplifier includes:
a second differential input pair including a first transistor and a second transistor; and
a second constant current source structured to supply an electric current to the second differential input pair, and
wherein the phase compensation capacitors are provided between a gate of the first transistor and a drain of the second transistor and between a gate of the second transistor and a drain of the first transistor.

6. The operational amplifier according to claim 5, wherein resistors are provided in series with the phase compensation capacitors between the gate of the first transistor and the drain of the second transistor and between the gate of the second transistor and the drain of the first transistor.

7. The operational amplifier according to claim 1, integrated in one semiconductor substrate.

8. The operational amplifier according to claim 7, wherein the phase compensation capacitors are provided between a gate of a first transistor and a drain of a second transistor and between a gate of the second transistor and a drain of the first transistor.

* * * * *